(12) United States Patent
Mochizuki et al.

(10) Patent No.: US 8,222,158 B2
(45) Date of Patent: Jul. 17, 2012

(54) ELECTRONIC DEVICE, METHOD OF MANUFACTURING THE SAME, DISPLAY AND SENSOR

(75) Inventors: Fumihiko Mochizuki, Kanagawa (JP); Atsushi Tanaka, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 146 days.

(21) Appl. No.: 12/832,077

(22) Filed: Jul. 8, 2010

(65) Prior Publication Data

US 2011/0006300 A1    Jan. 13, 2011

(30) Foreign Application Priority Data

Jul. 9, 2009    (JP) ................................ 2009-162508

(51) Int. Cl.
*H01L 21/302*    (2006.01)
(52) U.S. Cl. ................................ 438/733; 257/E21.223
(58) Field of Classification Search ........... 257/E21.223; 438/733, 745, 754
See application file for complete search history.

(56) References Cited

U.S. PATENT DOCUMENTS

| | | | | |
|---|---|---|---|---|
| 6,783,694 B1 * | 8/2004 | Lee et al. ...................... | 252/79.1 |
| 6,784,064 B2 * | 8/2004 | Yaegashi et al. .............. | 438/317 |
| 7,463,117 B2 * | 12/2008 | Ohara et al. .................. | 333/187 |
| 7,682,882 B2 * | 3/2010 | Ryu et al. ...................... | 438/149 |
| 7,741,230 B2 * | 6/2010 | Rachmady et al. ........... | 438/754 |
| 2008/0038924 A1 * | 2/2008 | Rachmady et al. ........... | 438/704 |
| 2008/0070393 A1 * | 3/2008 | Miyairi et al. ................ | 438/585 |
| 2010/0068875 A1 * | 3/2010 | Yeh et al. ...................... | 438/587 |

FOREIGN PATENT DOCUMENTS

| JP | 2007-134496 A | 5/2007 |
|---|---|---|
| JP | 2008-141113 A | 6/2008 |

OTHER PUBLICATIONS

SID 08 Digest, pp. 625 to 628.
Applied Physics Letters 90, 262106 (2007).
Osaka University nano-foundry H19 result report, "Kiki Riyo, F Handai H19-009", searched on Apr. 20, 2009, internet <http://foundry.osaka-u.ac.jp/isir/theme/report/H19/H19-009.pdf>.
Journal of the Korean Physical Society, vol. 53, No. 5, Nov. 2008, pp. 2603 to 2606.
Journal of Microelectromechanical Systems, vol. 12, No. 6, Dec. 2003, pp. 761 to 778.

* cited by examiner

*Primary Examiner* — Thao P. Le
(74) *Attorney, Agent, or Firm* — SOLARIS Intellectual Property Group, PLLC

(57) ABSTRACT

A method of manufacturing an electronic device includes: preparing a film-attached substrate including a substrate, and an oxide semiconductor film containing In, Ga, and Zn and a metal film containing at least one of W or Mo provided in this order on the substrate; and wet-etching the metal film of the film-attached substrate using an etching liquid of which a main component is hydrogen peroxide under conditions such that an etching selection ratio between the metal film and the oxide semiconductor film (etching rate of the metal film/etching rate of the oxide semiconductor film) is 100 or higher.

10 Claims, 6 Drawing Sheets

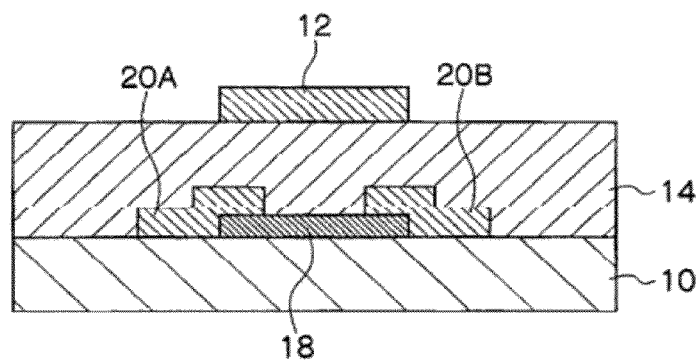
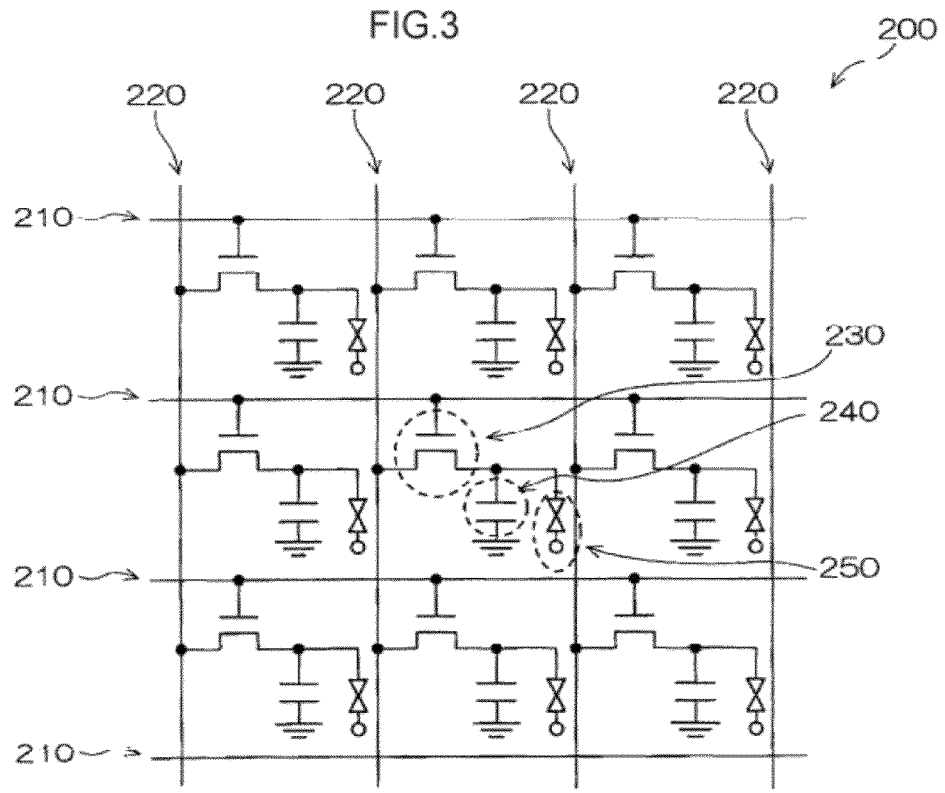

ELECTRONIC DEVICE, METHOD OF MANUFACTURING THE SAME, DISPLAY AND SENSOR

CROSS-REFERENCE TO RELATED APPLICATION

This Application claims priority under 35 USC 119 from Japanese Patent Application No. 2009-162508 filed on Jul. 9, 2009, the disclosure of which is incorporated by reference herein.

BACKGROUND OF THE INVENTION

1. Field of the Invention

The present invention relates to an electronic device, a method of manufacturing the electronic device, a display, and a sensor.

2. Description of the Related Art

In general, electronic devices (for example, thin film transistors (TFTs)) are manufactured in accordance with a method including a process of forming an electrode by patterning (pattern-processing), through photolithography and etching, a metal film formed on a semiconductor layer.

Along with the recent progress in reducing the size, weight, and power consumption of electronic apparatuses, oxides (IGZO) including indium (In), gallium (Ga), and zinc (Zn) have been attracting attention as a semiconductor layer material particularly in the field of displays.

Since IGZO (an IGZO film) can be formed on a resin substrate at low temperatures, IGZO is expected to be applied to a variety of applications including flexible displays.

IGZO films as described above (particularly, amorphous IGZO films) are easily etched by an acid. Examples of the acid include a mixed etching liquid containing hydrochloric acid and nitric acid (which is known as an etching liquid for polycrystalline ITO (indium tin oxide)) and an oxalic acid-containing etching liquid (which is known as an etching liquid for an amorphous ITO or for IZO (indium zinc oxide)).

Further, it has been reported that the IGZO film is etched also by an alkaline etching liquid (see, for example, Japanese Patent Application Laid-Open (JP-A) No. 2008-141113).

Since etching of IGZO films is easily performed using an etching liquid of any kind, it is thought that there are no significant problems in etchability of IGZO films themselves.

However, when an IGZO film is used in an electronic device such as a TFT, a metal film is formed directly on the IGZO film or on the IGZO film with another film interposed therebetween, and then patterning of the formed metal film is performed by photolithography and etching. When performing etching of the metal film in this process, the underlying IGZO film has a tendency to be eroded. The thickness reduction of the IGZO film causes deterioration in device characteristics of the electronic device (for example, transistor characteristics of the TFT) in some cases.

Here, the metal selected may be a film of a metal having a high melting point such as molybdenum (Mo) or tungsten (W) (see, for example, JP-A No. 2007-134496).

As an example of a study on the thickness reduction of the IGZO film, production of a bottom-gate TFT as a TFT for use in a liquid crystal display (LCD) using an IGZO film for a semiconductor layer and using Mo for a source electrode and a drain electrode has been reported (see, for example, SID 08 DIGEST, pages 625 to 628). In the report, a Mo film is formed on an IGZO film, and the Mo film is subjected to patterning by wet etching or dry etching.

According the above report, the underlying IGZO film is etched regardless of whether the Mo film is subjected to patterning by wet etching or dry etching. However, patterning by dry etching resulted in less thickness reduction of the IGZO film.

Specifically, the above report describes that, in wet etching, the etching rate (etching speed) of Mo is from 100 Å/sec to 150 Å/sec, the etching rate of IGZO is from 10 Å/sec to 30 Å/sec, and the etching selection ratio between Mo and IGZO (etching rate of Mo/etching rate of IGZO) is from 5 to 10. The above report further describes that, in dry etching, the etching rate of Mo is from 30 Å/sec to 40 Å/sec, the etching rate of IGZO is from 2 Å/sec to 3 Å/sec, and the etching selection ratio between Mo and IGZO (etching rate of Mo/etching rate of IGZO) is from 10 to 20.

However, when the Mo film on the IGZO film is subjected to patterning by dry etching, there are problems in that dry etching apparatuses which process large-area substrates such as those for use in flat panel displays (FPDs) are expensive, and that it is extremely difficult to perform uniform control over the entire region of the large area due to irregularities of plasma densities.

Further, in dry etching, since the IGZO film is exposed to high density plasma, electric resistance of the IGZO film tends to decrease (the number of carriers tends to increase), as a result of which there are cases where device characteristics (for example, transistor characteristics) are deteriorated. For example, it has been reported that, when Ar (argon) plasma is experimentally irradiated on an IGZO film, electric resistance of the IGZO film decreases as the plasma irradiation time increases (see, for example, Applied Physics Letters 90, 262106 (2007)). It is thought that $Ar^+$ ions generated in the Ar plasma increase the number of oxygen defects in IGZO, as a result of which the electric resistance is decreased (the number of carriers is increased). In general, most of plasma damages are incidents of this kind. Further, when the plasma energy is increased, the content of oxygen, In, Ga, or Zn changes, which may cause deterioration in device characteristics.

For the reasons described above, the method of patterning a metal on an IGZO film by dry etching has many problems from the viewpoints of costs and production suitability.

Further, it is also possible to perform a lift-off method that includes performing resist pattern formation on the IGZO film, Mo film formation, and resist pattern separation in this order as a method which does not involve dry etching and with which damage to the IGZO film is suppressed.

However, the lift-off method has problems in manufacturing, such as the following: (1) wastes easily occur due to the principle thereof, which is likely to cause a decrease in yield; (2) the cross-section of the resist pattern should have a reverse taper shape, which poses difficulty in the control of the resist pattern shape, and (3) there are cases where the Mo film is formed on a part of a reverse taper portion, at which a film should not be formed, of the resist pattern, so that a pattern edge, which should be formed in a straight line, often curves (in other words, cannot be formed in a straight line).

For the reasons described above, wet etching is preferred as a method of patterning a Mo film provided on an IGZO film, from the viewpoints of costs and production suitability.

A mixed etching liquid containing hydrochloric acid and nitric acid is generally used as an etching liquid for a Mo film. The mixed etching liquid containing hydrochloric acid and nitric acid is commercially available, for example, as "MO ETCHANT (trade name:)" from Kanto Chemical Co., Ltd.

Further, it has been reported that a Mo film is etched by an aqueous solution of hydrogen peroxide (see, for example, Osaka University nano-foundry H19 result report, "KIKI RIYO, F HANDAI H19-009", searched on 20 Apr. 2009, internet <http://foundry.osaka-u.ac.jp/isir/theme/report/H19/H19-009.pdf>, and Journal of the Korean Physical Society, vol. 53, No. 5, November 2008, pages 2603 to 2606).

Furthermore, it has been reported that a W film is also etched by an aqueous solution of hydrogen peroxide (see, for example, Journal of Microelectromechanical Systems, vol. 12, No. 6, December 2003, pages 761 to 778).

SUMMARY OF THE INVENTION

When performing wet etching of a metal film provided on an oxide semiconductor film including In, Ga, and Zn using the conventional techniques described above, the etching selection ratio between the metal film and the oxide semiconductor film (etching rate of the metal film/etching rate of the oxide semiconductor film) is 10 or lower. Therefore, further improvements are requested from the viewpoint of suppression of thickness reduction of the oxide semiconductor film and from the viewpoint of suppression of deterioration in device characteristics due to the film thickness reduction.

The etching selection ratio between the metal film and the oxide semiconductor film (etching rate of the metal film/etching rate of the oxide semiconductor film) is preferably as high as possible, considering that, in wet etching, the underlying oxide semiconductor film is continued to be etched by an etching liquid remaining on the substrate even after the completion of predetermined duration of an etching processes, and other factors.

The present invention has been made in consideration of the above, and provides an electronic device, a method of manufacturing the electronic device, a display, and a sensor.

According to a first aspect of the invention, there is provided a method of manufacturing an electronic device including: preparing a film-attached substrate including a substrate, and an oxide semiconductor film containing In, Ga, and Zn and a metal film containing at least one of W or Mo provided in this order on the substrate; and wet-etching the metal film of the film-attached substrate using an etching liquid of which a main component is hydrogen peroxide under conditions such that an etching selection ratio between the metal film and the oxide semiconductor film (etching rate of the metal film/etching rate of the oxide semiconductor film) is 100 or higher.

According to a second aspect of the invention, there is provided an electronic device manufactured by the method of manufacturing an electronic device according to the first aspect of the invention.

According to a third aspect of the invention, there is provided a display equipped with the electronic device according to the second aspect of the invention.

According to a fourth aspect of the invention, there is provided a sensor equipped with the electronic device according to the second aspect of the invention.

BRIEF DESCRIPTION OF THE DRAWINGS

FIG. 2 is a schematic diagram showing one example of a configuration of a top-gate TFT.

FIG. 3 is a conceptual diagram showing one example of a display of the present invention.

DETAILED DESCRIPTION OF THE INVENTION

<<Electronic Device and Manufacturing Method Thereof>>

Figure 1:
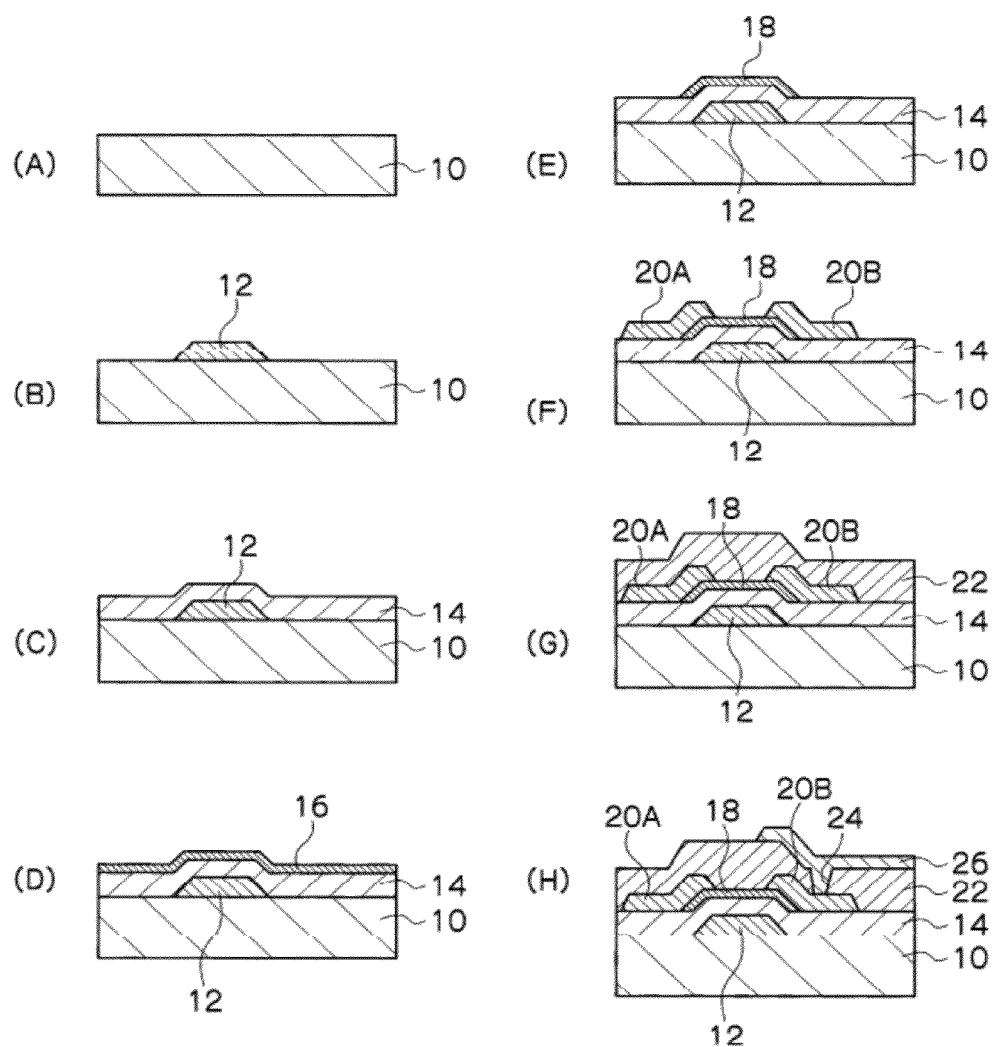
FIG. 1 is a flow chart showing one example of a method of manufacturing a thin film transistor (TFT) which is an embodiment of the present invention.

The method of manufacturing an electronic device of the present invention includes:

a process of preparing a film-attached substrate, the film-attached substrate including a substrate, and an oxide semiconductor film (hereinafter, also referred to as an "IGZO film") containing In, Ga, and Zn and a metal film containing at least one of W or Mo provided in this order on the substrate; and a process of wet-etching the metal film of the film-attached substrate using an etching liquid of which the main component is hydrogen peroxide under conditions such that the etching selection ratio between the metal film and the oxide semiconductor (etching rate of the metal film/etching rate of the oxide semiconductor film) is 100 or higher (hereinafter also referred to as an "etching process").

Further, the electronic device of the present invention is an electronic device manufactured by the method of manufacturing an electronic device of the present invention.

Since the method of manufacturing an electronic device includes the above processes, thickness reduction of the underlying IGZO film when performing wet etching of the metal film is suppressed, and deterioration in device characteristics (for example, transistor characteristics) due to the film thickness reduction is suppressed.

Further, since the method of manufacturing an electronic device of the present invention is capable of patterning the metal film without performing dry etching, deterioration of the IGZO film due to the dry etching (for example, reduction of electric resistance, or the like) is suppressed, and deterioration in device characteristics is suppressed.

Furthermore, since the method of manufacturing an electronic device of the present invention is capable of patterning the metal film without performing dry etching, electronic devices can be manufactured at low costs and can be manufactured on large-area substrates.

In an IGZO film, there is a tendency for a decrease in the content of oxygen to cause an increase in the number of carriers and a decrease in the electric resistance.

With regard to this point, in the method of manufacturing an electronic device of the present invention, oxygen defects in the IGZO film are terminated by O (oxygen), OH (hydroxide), H (hydrogen), or the like due to the use of the etching liquid of which the main component is hydrogen peroxide. Therefore, the number of carriers in the IGZO film is decreased, and reduction of electric resistance of the IGZO film is suppressed. As a result, deterioration in device characteristics (for example, a rise in OFF current in a thin film transistor) due to reduction of the electric resistance of the IGZO film is suppressed.

In the following, each of the processes of the method of manufacturing an electronic device of the present invention is described, and, subsequently, embodiments of the electronic device of the present invention and the manufacturing method thereof are further described in detail.

<Process of Preparing Film-Attached Substrate>

The method of manufacturing an electronic device of the present invention includes preparing a film-attached substrate which includes a substrate and an oxide semiconductor film containing In, Ga, and Zn and a metal film containing at least one of W or Mo provided in this order on the substrate.

In the method of manufacturing an electronic device of the present invention, a film-attached substrate that is prepared beforehand may be used; or, alternatively, a film-attached substrate may be prepared (namely, a film-attached substrate is prepared by forming, on a substrate, an IGZO film and a metal film in this order) each time an electronic device is prepared and the film-attached substrate prepared may be used.

The film-attached substrate may include one or more additional films other than the IGZO film and the metal film, if necessary. Examples of the additional films include a gate electrode and a gate insulating film, which are constituent elements of thin film transistors (TFTs).

(Substrate)

There is no particular limitation on the substrate in the present invention. Examples of substrates which may be used include inorganic substrates such as a substrate of YSZ (zirconia-stabilized yttrium) or glass; and resin substrates such as a substrate of a synthetic resin, examples of the synthetic resin including polyesters such as polyethylene terephthalate (PET), polybutylene terephthalate, and polyethylene naphthalate (PEN), polystyrene, polycarbonate, polyethersulfone, polyarylate, allyl diglycol carbonate, polyimide, polycycloolefin, norbornene resins, and polychlorotrifluoroethylene (hereinafter, these resin substrates are also referred to as "plastic substrates").

Among them, a resin substrate is preferable from the point of being lightweight and from the point of having flexibility.

Further, it is preferred that the resin substrate has excellent properties in at least one of thermal resistance, dimensional stability, solvent resistance, electrically insulating property, workability, low gas permeability or low hygroscopic property.

Since resin substrates generally have poor thermal resistance, when preparing an electronic device on a resin substrate, the processing temperature in the manufacturing process of the electronic device is preferably set to be 200° C. or lower, and more preferably 150° C. or lower.

With regard to this point, since an IGZO film, which can be formed at low temperatures (for example, by sputtering), is used as a semiconductor layer in the electronic device of the present invention, the processing temperature in the manufacturing process of the electronic device can be set to be 200° C. or lower.

Therefore, for example, a TFT can be formed on a resin substrate to form an electronic device of the present invention, and a flexible display can be prepared using the obtained TFT substrate.

The resin substrate may be provided with at least one of a gas barrier layer for preventing permeation of moisture or oxygen, an undercoat layer for improving flatness of the resin substrate or adhesion to a lower electrode, or another layer.

The thickness of the substrate in the present invention is preferably from 50 μm to 500 μm.

When the thickness is 50 μm or more, the flatness of the substrate itself is more improved.

When the thickness is 500 μm or less, the flexibility of the substrate itself is more improved, and the use of the substrate as a substrate for a flexible display is facilitated.

(Oxide Semiconductor Film (IGZO Film) Containing In, Ga, and Zn)

The oxide semiconductor film (IGZO film) containing In, Ga, and Zn in the invention is a film which is provided on the substrate directly or on another layer interposed between the substrate and the IGZO film, and which is suitable for use as a semiconductor layer (an active layer) in an electronic device.

The IGZO film may be a film that is not patterned (an undivided film) or may be a patterned film (which may be, for example, patterned in an island shape).

As the IGZO film in the invention, known IGZO films such as those disclosed in JP-A No. 2006-165529 may be used.

It is preferable that the IGZO film is amorphous (noncrystalline) from the viewpoints of ease of patterning (etching), decrease in the processing temperature, reduction of surface roughness, and the like.

It may be confirmed by X-ray diffraction whether or not the IGZO film is amorphous (noncrystalline). When a clear peak showing a crystal structure is not detected by X-ray diffraction, it is confirmed that the IGZO film is amorphous.

The thickness of the IGZO film in the invention is preferably from 20 nm to 150 nm from the viewpoints of, for example, device characteristics.

Here, the film thickness can be determined by stylus surface profile measurement. The same applies to the determination of the film thicknesses of the below-described metal film and other films.

Further, the oxide semiconductor in the present invention (IGZO) is preferably a compound represented by the following Formula (I), from the viewpoints of device characteristics and ease of adjusting the etching selection ratio to 100 or higher.

$$(In_{2-X}Ga_X)O_3 \cdot (ZnO)_m \qquad \text{Formula (I)}$$

In Formula (I), X represents a number of from greater than 0 to smaller than 2, and m represents a positive integer.

X preferably represents a number of from 0.5 to 1.5, and more preferably from 0.8 to 1.2, from the viewpoints of device characteristics and ease of adjusting the etching selection ratio to 100 or higher.

m preferably represents an integer of from 1 to 3, more preferably an integer of 1 or 2, and particularly preferably 1, from the viewpoints of device characteristics and ease of adjusting the etching selection ratio to 100 or higher.

$InGaZnO_4$ is most preferable as the compound represented by Formula (I).

The composition ratio of the IGZO film can be determined by RBS (Rutherford back scattering) analysis, XRF (fluorescent X-ray) analysis, or other methods.

There is no particular limitation on the method of forming the IGZO film in the invention. However it is preferred that the IGZO film is formed by a vapor phase film forming method, using at least a polycrystalline sintered body of IGZO as a target (IGZO target). Among vapor phase film forming methods, sputtering and pulse laser deposition (PLD) are preferable. Sputtering is particularly preferable from the viewpoint of mass productivity.

Next, conditions for the sputtering that are preferable in terms of facilitating the adjustment of the etching selection ratio to 100 or higher are described.

Concerning the manner of sputtering, reactive sputtering that is performed while introducing argon (Ar) and oxygen ($O_2$) is preferable.

In this process, the flow rate of Ar is preferably from 50 sccm to 150 sccm.

The flow rate of $O_2$ is preferably from 0.5 sccm to 5.0 sccm.

The flow rate ratio (flow rate of Ar/flow rate of $O_2$) is preferably in the range of from 10 to 200 (for example, when the flow rate of Ar is 100 sccm, the flow rate of $O_2$ is preferably from 0.5 sccm to 10 sccm.).

The final vacuum degree (when gas is not introduced) is preferably from $4 \times 10^{-6}$ Pa to $8 \times 10^{-6}$ Pa, and more preferably from $5 \times 10^{-6}$ Pa to $7 \times 10^{-6}$ Pa.

The film forming pressure (when gas is introduced) is preferably from 0.1 Pa to 5.0 Pa, and more preferably from 0.1 Pa to 1.0 Pa.

The film forming temperature (the temperature of the substrate) is preferably from 15° C. to 40° C., and more preferably from 15° C. to 30° C.

Note that, in the invention, the expression "sccm" is an abbreviation for "standard cc/min", and represents a value obtained by converting the volume (cc) of gas introduced into a vacuum device (for example, a film forming chamber) in one minute to that under the standard condition (1013.25 hPa (1 atm), 0° C.).

For example, "1 sccm" in the invention means that the flow rate of gas is equivalent to 1 cc/min at 0° C. and 1013.25 hPa (1 atm).

The manner of the above sputtering may be a manner in which the IGZO target is used alone, or may be a co-sputtering manner in which a $Ga_2O_3$ target and a ZnO target are used together with the IGZO target. The co-sputtering facilitates adjustment of the composition ratio (mole ratio).

When co-sputtering, electric power may be supplied to the IGZO target from a DC (direct current) power generator or a RF (radio frequency) power generator, and electric power may be supplied to the ZnO target from a DC (direct current) power generator or a RF (radio frequency) power generator. Further, electric power may be supplied to the $Ga_2O_3$ target from an RF power generator.

The electric power (RF) that is supplied to the IGZO target may be set to be, for example, within a range of from 100 W to 300 W (for example, from 150 W to 250 W).

The electric power (DC) that is supplied to the ZnO may be set to be, for example, within a range of from 2 W to 10 W (for example, from 2 W to 6 W).

The electric power (RF) that is supplied to the $Ga_2O_3$ target may be set to be, for example, within a range of from 40 W to 100 W (for example, from 60 W to 80 W).

(Metal Film Containing at Least One of W or Mo)

In the present invention, the metal film containing at least one of W or Mo is a film which is disposed on the IGZO film directly or on another layer interposed between the IGZO film and the metal film.

There is no particular limitation on the metal film according to the invention, as far as the metal film contains at least one of W or Mo. The metal film according to the invention may be a W film or a Mo film, or may be an alloy film such as a Mo—W film. Further, the metal film according to the invention may be an alloy film containing at least one of W or Mo and another metal (for example, a Mo alloy film such as Mo—Nb (molybdenum-niobium) film).

Among them, a Mo film or a Mo alloy film is preferable, and a Mo film is particularly preferable, from the viewpoint of facilitating the adjustment of the etching selection ratio to 100 or higher.

The metal film in a patterned (wet-etched) state is used as an electrode or electrodes in an electronic device.

For example, when the electronic device of the present invention is a bottom-gate TFT, the metal film serves as a source electrode and a drain electrode.

In consideration of film forming properties, capability of patterning by etching, electric conductivity (reduction of electric resistance), and the like, the film thickness of the metal film is preferably from 10 nm to 1000 nm.

There is no particular limitation on the method of forming the metal film. The metal film is preferably formed by a vapor phase film forming method, using a metal target containing at least one of W or Mo. Among vapor phase film forming methods, sputtering and pulse laser deposition (PLD) are more preferable, and sputtering is particularly preferable from the viewpoint of mass productivity.

Next, conditions for the sputtering that are preferable in view of facilitating the adjustment of the etching selection ratio to 100 or higher are described.

The final vacuum degree (when gas is not introduced) is preferably from $4 \times 10^{-6}$ Pa to $8 \times 10^{-6}$ Pa, and more preferably from $5 \times 10^{-6}$ Pa to $7 \times 10^{-6}$ Pa.

The film forming pressure (when gas is introduced) is preferably from 0.1 Pa to 5.0 Pa, and more preferably from 0.1 Pa to 0.5 Pa.

The film forming temperature (the temperature of the substrate) is preferably 150° C. or lower, and more preferably from 20° C. to 40° C.

<Etching Process>

The etching process in the present invention is a process of wet-etching the metal film of the film-attached substrate by using an etching liquid of which the main component is hydrogen peroxide under conditions such that the etching selection ratio between the metal film and the oxide semiconductor film (etching rate of the metal film/etching rate of the oxide semiconductor film) is 100 or higher.

In the invention, the "etching selection ratio between the metal film and the oxide semiconductor film (etching rate of the metal film/etching rate of the oxide semiconductor film)" is simply referred to as an "etching selection ratio" in some cases.

With respect to a specific embodiment of the etching process, it is preferable that a resist pattern is formed on the metal film by photolithography in advance and etching of the metal film is performed using the resist pattern as an etching mask.

The term "etching rate" (which is also referred to as an "etching speed") means the etching amount (unit: nm/min) in the direction of film thickness per one minute. Here, the "etching amount in the direction of film thickness" has the same meaning as the "film thickness reduction amount" described below.

The etching rate is calculated using a spectroscopic ellipsometer and a contact-stylus film thickness gage.

The factors that affect the etching selection ratio are not limited to the composition of the etching liquid, and there are cases where the etching selection ratio is changed by one or more of the temperature of the etching liquid, the composition and film properties (for example, film density) of the metal film, the composition and film properties (for example, film density) of the oxide semiconductor film, or the like. Therefore, in the method of manufacturing an electronic device of the present invention, it is preferred that these factors are adjusted to make the etching selection ratio 100 or higher.

From the viewpoint of ease of adjusting the etching selection ratio to 100 or higher, the temperature of the etching liquid is preferably from 15° C. to 40° C., and more preferably from 15° C. to 30° C.

Preferable ranges of other conditions, such as the composition of the oxide semiconductor film, are as described above.

When the etching selection ratio is lower than 100, there are cases where the thickness reduction amount of the underlying IGZO film increases, and device characteristics (transistor characteristics when preparing a thin film transistor (TFT) as the electronic device) of the electronic device to be prepared are deteriorated.

From the viewpoint of further suppressing the thickness reduction of the IGZO film, the etching selection ratio is preferably 500 or higher, more preferably 1,000 or higher, even more preferably 5,000 or higher, and particularly preferably 10,000 or higher.

In the present invention, an etching liquid containing hydrogen peroxide as the main component is used.

The etching liquid in the invention may contain an additional component other than hydrogen peroxide, as needed. However, from the viewpoint of increasing the etching selection ratio, the etching liquid in the invention is preferably an aqueous solution of hydrogen peroxide, which includes water as a solvent and hydrogen peroxide as a solute.

Here, the term "main component" means the component that has the highest content of all the components, excluding solvents such as water, of the etching liquid. Specifically, the content of hydrogen peroxide relative to all the components, excluding solvents, of the etching liquid is preferably 80% by mass or higher, more preferably 90% by mass or higher, and particularly preferably 95% by mass or higher.

The proportion of all the components excluding solvents relative to the total amount of the etching liquid (for example, the concentration of hydrogen peroxide when an aqueous solution of hydrogen peroxide is used as the etching liquid) is preferably from 20% by mass to 50% by mass, more preferably from 25% by mass to 45% by mass, and particularly preferably from 25% by mass to 40% by mass.

<Additional Processes>

The method of manufacturing an electronic device of the present invention may include an additional process other than the above processes, as needed.

Examples of the additional process include a process of forming an additional film such as an insulating film and respective processes that are performed when forming a TFT as an electronic device (for example, a gate electrode forming process, a gate insulating film forming process, a protective film forming process, an interlayer insulating film forming process, a contact hole forming process, or a pixel electrode forming process).

Description of the electronic device of the present invention and the manufacturing method thereof are given above. The electronic device of the present invention is not particularly limited as far as the device includes, on a substrate, an IGZO film and the metal film which has been patterned by the wet etching described above.

As a specific embodiment of the electronic device of the present invention, for example, a thin film transistor (hereinafter, also referred to as a "TFT") is preferable.

When the electronic device of the present invention is a TFT, the TFT includes at least: an IGZO film as a semiconductor layer (an active layer); the metal film pieces (pieces of the metal film obtained by patterning through wet etching described above) as the source electrode and drain electrode; a gate electrode; and a gate insulating film. If necessary, the TFT may further include an interlayer insulating film and/or a pixel electrode.

Embodiments

In the following, specific embodiments of the electronic device of the present invention and the manufacturing method thereof are described. However, the present invention is not limited to the following embodiments.

FIG. 1 is a flow chart showing an example of a method of manufacturing a thin film transistor (TFT), which is an embodiment of the present invention.

—Substrate—

First, a substrate 10 for forming a TFT is provided (FIG. 1(A)).

There is no particular limitation as to the shape, structure, size, or the like of the substrate 10. The shape, structure, size, or the like thereof may be suitably selected according to the purposes and the like. The structure of the substrate 10 may be a single layer structure, or may be a laminated structure (multi-layer structure).

—Gate Electrode—

A gate electrode 12 is formed on the substrate 10 (FIG. 1(B)).

The material of the gate electrode 12 may be a material having electric conductivity and thermal resistance (500° C. or higher). Examples of materials that can be used for forming the gate electrode 12 include metals such as Al, Mo, Cr, Ta, Ti, Au, and Ag; alloys such as Al—Nd and APC (trade name, manufactured by Furuya Metal Co., Ltd.; Ag alloy); and metal oxide electrically conductive films such as a conductive film of tin oxide, zinc oxide, indium oxide, indium tin oxide (ITO), or indium zinc oxide (IZO).

The gate electrode 12 is formed on the substrate 10 by, for instance, a method appropriately selected in consideration of the suitability to the material that is used to form the gate electrode. Examples thereof include wet methods such as a printing method and a coating method; physical methods such as a vacuum deposition method, a sputtering method, and an ion plating method; and chemical methods such as CVD (chemical vapor deposition) and a plasma CVD method. The thickness of the gate electrode 12 is preferably from 10 nm to 1000 nm.

After the film formation, patterning by photolithography and etching is performed to give a predetermined shape. In this process, it is preferred that the patterning of the gate electrode 12 is performed simultaneously with the patterning of gate wires (not shown).

—Gate Insulating Film—

After forming the gate electrode 12 on the substrate 10, a gate insulating film 14 is formed (FIG. 1 (C)).

The gate insulating film 14 is a film having insulating property and thermal resistance (500° C. or higher). For example, the gate insulating film 14 may be an insulating film of $SiO_2$, $SiN_x$, $SiON$, $Al_2O_3$, $Y_2O_3$, $Ta_2O_5$, $HfO_2$, or the like or may be an insulating layer containing at least two of these compounds.

Similar to the above, the gate insulating film 14 is formed on the substrate 10 by a method appropriately selected in consideration of the suitability to the material that is used to form the gate insulating film. Examples thereof include wet methods such as a printing method and a coating method; physical methods such as a vacuum deposition method, a sputtering method, and an ion plating method; and chemical methods such as CVD and a plasma CVD method. Then, patterning by a photolithography and etching is performed to give a predetermined shape, as necessary.

Note that, the gate insulating film 14 should be thick enough to reduce the leak current and to improve the voltage resistance. However, when the gate insulating film 14 is too thick, a rise in drive voltage occurs. Although the thickness of the gate insulating film 14 is set in consideration of the material of the gate insulating film 14, the thickness of the gate insulating film 14 is preferably from 10 nm to 10 μm, and more preferably from 50 nm to 1000 nm.

—Active Layer (Semiconductor Layer)—

After forming the gate insulating film 14, the IGZO film 16 described above is formed (FIG. 1 (D)).

Subsequently, the IGZO film 16 is patterned to form an active layer 18 (FIG. 1 (E)). Here, the active layer 18 is formed to have a pattern of, for example, an island shape, so that the active layer 18 has an overlapping portion with the gate electrode 12 when viewed from the normal direction of the substrate 10.

Patterning of the IGZO film 16 may be performed by a photolithography and etching. Specifically, the IGZO film 16 provided on the gate insulating film 14 is patterned by providing a resist at portions that should remain as the active layer 18 by photolithography, and then etching the IGZO film 16 with an acid solution such as hydrochloric acid, nitric acid, dilute sulfuric acid, or a mixed liquid of phosphoric acid, nitric acid, and acetic acid (AL ETCHANT, trade name, manufactured by Kanto Chemical Co., Ltd.), as a result of which the active layer 18 is formed. An aqueous solution including phosphoric acid, nitric acid, and acetic acid is a preferable example since the use thereof ensures removal of the exposed portions of the IGZO film 16.

—Source Electrode and Drain Electrode—

Next, a metal film for forming a source electrode 20A and a drain electrode 20B is formed on the active layer 18 and the gate insulating film 14.

The above-described metal film containing at least one of W or Mo is used as the metal film.

In light of film forming property, capability of patterning by etching, electric conductivity (reduction of electric resistance), and the like, it is preferred that the film thickness of the metal film is from 10 nm to 1000 nm.

Then, the source electrode 20A and the drain electrode 20B, which contact with the active layer 18, are formed by patterning the metal film by etching (FIG. 1 (F)).

Here, the source electrode 20A and the drain electrode 20B are provided such that each of the source electrode 20A and the drain electrode 20B has an overlapping portion with the gate electrode 12 and the active layer 18 when viewed from the normal direction of the substrate 10.

Here, a resist pattern is formed by a photolithography method at portions where the metal film should remain, and then wet etching is performed using an etching liquid of which the main component is hydrogen peroxide, thereby forming a source electrode and a drain electrode. In this process, it is preferred that the source electrode, the drain electrode, and wires (for example, data wires) that are connected to these electrodes are patterned at the same time.

As described above, the wet etching is performed under conditions such that the etching selection ratio between the metal film and the IGZO film (etching rate of the metal film/etching rate of the IGZO film) is 100 or higher. As a result, thickness reduction of the IGZO film is suppressed, and deterioration in transistor characteristics (for example, a decrease in ON current) due to the thickness reduction is suppressed.

Further, in the wet etching, oxygen defects in the IGZO film are terminated by O, OH, H, or the like due to the use of hydrogen peroxide. Therefore, the number of carriers in the IGZO film is decreased, and reduction of the electric resistance of the IGZO film is suppressed.

As a result, a rise in OFF current due to reduction of the electric resistance of the IGZO film is suppressed.

For the reasons described above, the wet etching described above improves the ON-OFF ratio (ON current/OFF current) of the TFT formed, and improves transistor characteristics (device characteristics) thereof.

—Protective Film—

After forming the source electrode 20A, the drain electrode 20B, and the wires, a protective film 22 is formed (FIG. 1 (G)).

Examples of materials that can be used to form the protective film 22 include metal oxides such as MgO, SiO, $SiO_2$, $Al_2O_3$, GeO, NiO, CaO, BaO, $Fe_2O_3$, $Y_2O_3$, and $TiO_2$; metal nitrides such as $SiN_x$, and $SiN_xO_y$; metal fluorides such as $MgF_2$, LiF, $AlF_3$ and $CaF_2$; polyethylene; polypropylene; polymethyl methacrylate; polyimide; polyurea; polytetrafluoroethylene; polychlorotrifluoroethylene; polydichlorodifluoroethylene; copolymers of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymer main chain; water absorbing substances each having a coefficient of water absorption of 1% or higher; and moisture permeation preventive substances each having a coefficient of water absorption of 0.1% or lower.

There is no particular limitation on the method of forming the protective film 22. Examples of the method include a vacuum deposition method, a sputtering method, a reactive sputtering method, an MBE (molecular beam epitaxy) method, a cluster ion beam method, an ion plating method, a plasma polymerization method (a high-frequency excitation ion plating method), a plasma CVD method, a laser CVD method, a thermal CVD method, a gas source CVD method, a coating method, a printing method and a transfer method. The method of forming the protective film 22 may be selected according to the material to be used.

Although the thickness of the protective film 22 may be set in consideration of the material of the protective film and the like, the thickness of the protective film 22 is usually from 50 nm to 1000 nm.

—Pixel Electrode—

When preparing a TFT for use in a display (for example, a liquid crystal display or an organic EL (electroluminescence) display), subsequent to the formation of the protective film 22, a contact hole 24 is formed on the protective film 22 by photolithography and etching, and then a pixel electrode 26 and the like are formed (FIG. 1 (H)).

For example, after forming a film of indium tin oxide (ITO) by sputtering, the film is patterned by photolithography and etching, as a result of which a patterned pixel electrode 26, which connects to the drain electrode 20B through the contact hole 24, is obtained.

In the above description, embodiments of the present invention are explained. However the present invention is not limited to the above embodiments.

The present invention is not limited to the manufacture of a bottom-gate TFT. For example, the present invention may be applied also to manufacturing a top-gate TFT having a configuration shown in FIG. 2. When the present invention is applied to the method of manufacturing a top-gate TFT, the manufacturing method thereof includes: forming an IGZO film on a substrate 10; pattern-processing the IGZO film to prepare an active layer 18; forming a source electrode 20A and a drain electrode 20B by sputtering, resist pattern formation, and the wet etching described above; and forming a gate insulating film 14 and a gate electrode 12 in this order.

There is no particular limitation as to the use of the electronic device of the present invention. For example, the electronic device of the present invention is preferably used as a driving device in a display (for example, a liquid crystal display, an organic EL (electroluminescence) display, an inorganic EL display, or the like).

Further, the electronic device of the present invention is preferably used as a driving element (drive circuit) in a variety of electron devices such as devices which can be prepared through a low-temperature process using a resin substrate (for example, a flexible display), sensors such as an X-ray sensor, MEMS (micro electro mechanical systems), actuators, endoscopes (including a capsule endoscope), and catheters including a shape memory metal for use in the medical field, and ultrasonic probes (including MEMS ultrasonic probes).

<Display and Sensor>

The display of the present invention and the sensor of the present invention include the above-described electronic device of the present invention.

Preferable examples of the display include a liquid crystal display, an organic EL (electroluminescence) display, and an inorganic EL display.

Preferable examples of the sensor include image sensors, such as CCD (charge coupled device) image sensors or CMOS (complementary metal oxide semiconductor) image sensors, and X-ray sensors.

The display of the present invention is excellent in terms of display quality, since it is equipped with the electronic device of the present invention, in which thickness reduction of the IGZO film is suppressed and which has excellent device characteristics.

The sensor of the present invention is highly sensitive, since it is equipped with the electronic device of the present invention, in which thickness reduction of the IGZO film is suppressed and which has excellent device characteristics.

FIG. 3 is a conceptual diagram illustrating a liquid crystal display 200, which is an example of the display of the present invention.

As shown in FIG. 3, the liquid crystal display 200 is equipped with plural gate wires 210 which are parallel to each other and plural data wires 220 which are parallel to each other. The data wires 220 and the gate wires 210 are placed in such a manner that the data wires 220 are intersected with the gate wires 210. Here, the gate wires 210 are electrically insulated from the data wires 220. A thin film transistor (TFT) 230 is disposed in a portion at or around an intersection of a gate wire 210 and a data wire 220.

A gate electrode of the thin film transistor 230 is connected to the gate wire 210, and a source electrode of the thin film transistor 230 is connected to the data wire 220. Further, a drain electrode of the thin film transistor 230 is connected to a pixel electrode. A liquid crystal 250 is held between the pixel electrode and an opposing electrode (not shown). Moreover, the pixel electrode and an earthed opposing electrode form a condenser 240.

The electronic device of the present invention is preferably used as the thin film transistor 230.

The thin film transistor 230 improves the display quality of the liquid crystal display 200, since thickness reduction of the semiconductor layer formed using the IGZO film is suppressed, and thus the thin film transistor 230 exhibits excellent transistor characteristics.

Further, according to the present invention, since the thin film transistor 230 can be prepared using, as a semiconductor layer, the IGZO film which is capable of film formation at low temperatures (for example, at 200° C. or lower), a resin substrate (a plastic substrate) can be used as a substrate.

Therefore, according to the present invention, a liquid crystal display which is flexible and has excellent display quality, and an EL display (an organic EL display or an inorganic EL display) which is flexible and has excellent display quality, are provided.

Figure 4:
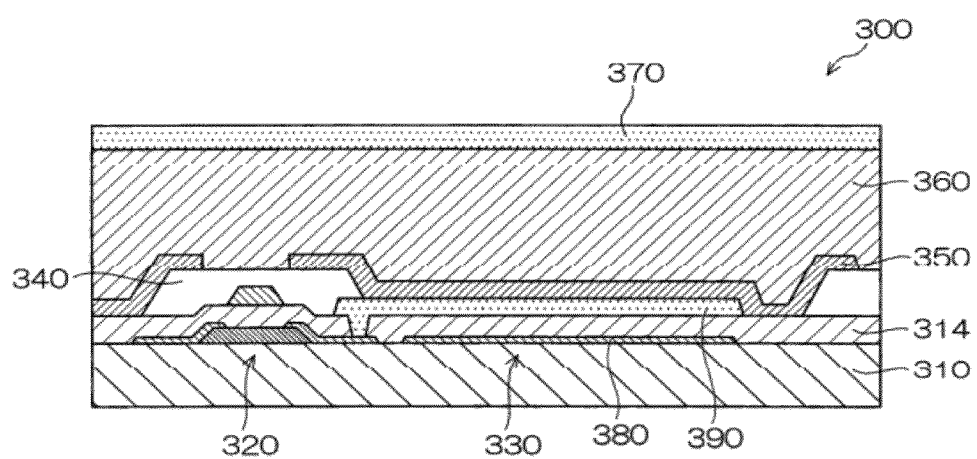
FIG. 4 is a conceptual sectional view showing one example of a sensor of the present invention.

FIG. 4 is a conceptual sectional view illustrating an X-ray sensor 300, which is an example of the sensor of the present invention. More specifically, FIG. 4 is a magnified conceptual sectional view showing a part of an X-ray sensor array.

As shown in FIG. 4, the X-ray sensor 300 includes a substrate 310, a TFT 320 and a capacitor 330 which are disposed on a substrate 310, an electric charge-collecting electrode 350 which is disposed on the capacitor 330, an X-ray conversion layer 360, and an upper layer electrode 370.

In FIG. 4, the TFT 320 is a top-gate TFT similar to the TFT shown in FIG. 2; however, the TFT in the sensor of the present invention is not limited to a top-gate TFT and may be a bottom-gate TFT.

A passivation film 340 is formed on the TFT 320.

The capacitor 330 has a configuration in which an insulating film 314 is interposed between a capacitor-lower electrode 380 and a capacitor-upper electrode 390. The material of the capacitor-lower electrode 380 is the same as the material of a source electrode and drain electrode of the TFT 320. The capacitor-lower electrode 380 is formed by patterning simultaneously with patterning of the source electrode and drain electrode of the TFT 320. The capacitor-upper electrode 390 is connected to either one of the source electrode or drain electrode of the TFT 320 through a contact hole that is provided on the insulating film 314.

The electric charge-collecting electrode 350 is provided on the capacitor-upper electrode 390 in the capacitor 330, and is in contact with the capacitor-upper electrode 390.

The X-ray conversion layer 360 is a layer including amorphous selenium, and is provided over the TFT 320 and the capacitor 330.

The upper layer electrode 370 is provided on the X-ray conversion layer 360, and is in contact with the X-ray conversion layer 360.

In the X-ray sensor 300 having the above configuration, X-rays are irradiated from the upper part (from the side of the upper layer electrode 370) of FIG. 4, and electron-hole pairs (generated electric charges) are generated in the X-ray conversion layer 360. Application of a high electric field to the X-ray conversion layer 360 by the upper layer electrode 370 results in accumulation of the generated electric charges in the capacitor 330. The TFT 320 is scanned in order, thereby performing readout.

The TFT 320 improves the sensitivity of the X-ray sensor 300, since thickness reduction of the semiconductor layer formed using the IGZO film is suppressed whereby the TFT 320 exhibits excellent transistor characteristics.

EXAMPLES

In the following, the present invention is further described in detail with reference to examples. However, the examples should not be construed as limiting the present invention. Unless otherwise noted, "part(s)" and "%" are on the mass basis.

Example 1

Measurement of Etching Rate

In Example 1, each of the etching rates (nm/min) of an IGZO film, a Mo film, a W film, an Al (aluminum) film (for reference purpose), and an ITO film (for reference purpose) in an aqueous solution of hydrogen peroxide was measured.

First, an IGZO film, a Mo film, a W film, an Al film, and an ITO film were respectively formed on silicon wafers (hereinafter, also referred to as "film-forming substrate(s)" or "substrate(s)").

<Formation of IGZO Film>

An IGZO film was formed by co-sputtering using three targets—a single phase IGZO sintered body target (having a density of 6.3 g/cm$^3$) having a composition ratio (mole ratio) of In:Ga:Zn=1:1:1, a Ga$_2$O$_3$ target, and a ZnO target—such that the resulting IGZO film would have a composition ratio (mole ratio) of In:Ga:Zn=1:1:1.

A measurement of the composition ratio (mole ratio) of the formed IGZO film using an X-ray fluorescence (XRF) analyzer confirmed that the formed IGZO film had a composition ratio of In:Ga:Zn=1:1:1.

The composition ratio (mole ratio) between In, Ga, Zn, and oxygen was revealed to be In:Ga:Zn:O=1:1:1:4.

Hereinafter, the obtained IGZO film is referred to as the "IGZO film (In:Ga:Zn=1:1:1)" in some cases.

The film thickness of the IGZO film was set to 50 nm. Adjustment of the film thickness was performed by adjusting the duration of the film formation (the thickness of the Mo film described below was adjusted in a similar manner.).

Further, a measurement of the carrier density of the obtained IGZO film using an AC (alternating current) Hall measurement system (RESITEST 8300, trade name, manufactured by Toyo-Technica Co., Ltd.) revealed that the carrier density was $2\times10^{16}$ cm$^{-3}$.

Further, although X-ray diffraction was performed on the resulting IGZO film, a clear peak indicating a crystal structure was not detected. Thus, it was confirmed that the IGZO film was an amorphous film (a noncrystalline film).

In this example, an IGZO film was formed by co-sputtering using a Ga$_2$O$_3$ target and a ZnO target together with the IGZO target in order to obtain an IGZO film having a composition ratio (mole ratio) of In:Ga:Zn=1:1:1.

The reason for additionally using a Ga$_2$O$_3$ target and a ZnO target is described below. When an IGZO film is formed by sputtering using only a single phase IGZO target having a composition ratio (mole ratio) of In:Ga:Zn=1:1:1, the composition of the IGZO film becomes In:Ga:Zn=1:0.8-0.9:0.65-0.75, which is different from the composition of composition of the IGZO target. This is because the sputtering rate of each element (m, Ga, or Zn) is different.

Therefore, the sputtering for forming the IGZO film in this example was set to be co-sputtering using a Ga$_2$O$_3$ target and a ZnO target together with the IGZO target in order to compensate for insufficiency of the amount of Ga and the amount of Zn.

Figure 5:
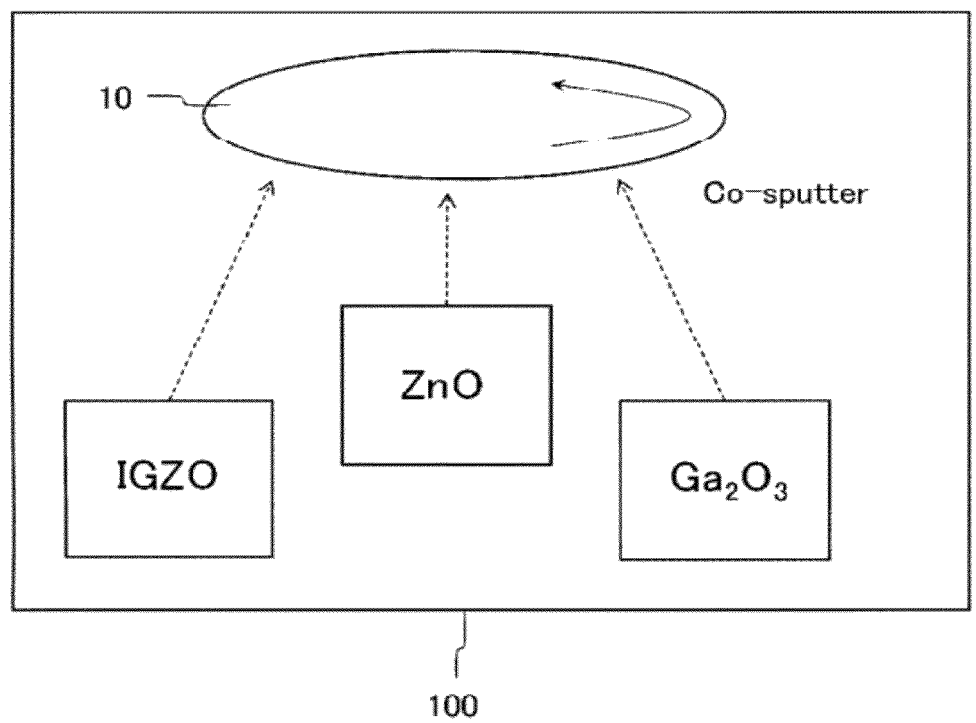
FIG. 5 is a schematic diagram of a film forming chamber in a sputtering apparatus, which is used in the formation of an IGZO film in an embodiment of the present invention.

Specifically, as shown in the schematic diagram of FIG. 5, co-sputtering was performed in the following manner. In a film forming chamber 100 of the sputtering apparatus, an IGZO target, a Ga$_2$O$_3$ target, and a ZnO target were each placed to face a substrate 10, and, while rotating the substrate 10 (see the arrow of a solid line in FIG. 5), co-sputtering was performed (see the arrow of a dashed line in FIG. 5) using the targets.

In this example, electric power was supplied from an RF power generator to the IGZO target and the Ga$_2$O$_3$ target, and electric power was supplied from a DC power generator to the ZnO target. However, the present invention is not limited to this embodiment. For example, electric power may be supplied from a DC power generator to the IGZO target, and electric power may be supplied from an RF power generator to the ZnO target.

The sputtering conditions for forming the IGZO film are described below in detail.

~Sputtering Conditions for Forming IGZO Film~

Final vacuum degree (when gas is not introduced): $6\times10^{-6}$ Pa

Film-forming pressure (when gas is introduced): $4.07\times10^{-1}$ Pa

Film-forming temperature: room temperature (substrate temperature: from 23° C. to 25° C.)

Flow rate of Ar: 100 sccm

Flow rate of O$_2$: 0.9 sccm

Substrate rotating speed: 25 rpm

Power supply: RF 200 W to the IGZO target; RF 69 W to the Ga$_2$O$_3$ target; and DC 4 W to the ZnO target <Formation of Mo Film>

A Mo film having a thickness of 100 nm was formed on a silicon wafer by sputtering under the following conditions.

~Sputtering Conditions for Forming Mo Film~

Target: 4-inch Mo target (purity 4N (a purity of 99.99% or higher))

Sputtering system: DC magnetron sputtering

Final vacuum degree (when gas is not introduced): $6\times10^{-6}$ Pa

Film forming pressure (when gas is introduced): $4.1\times10^{-1}$ Pa

Film forming temperature: room temperature (substrate temperature: from 23° C. to 25° C.)

Flow rate of Ar: 100 sccm

Power supply: DC 260 W

<Formation of W Film>

A W film having a film thickness of 100 nm was formed on a silicon wafer by deposition under the following conditions.

~Deposition Conditions for Forming W Film~

EB (electron beam) deposition method

Deposition material: W, purity 4N (manufactured by Japan Pure Chemical Co., Ltd.)

Final vacuum degree: $2.0\times10^{-4}$ Pa

Film forming rate: 20 nm/min

<Formation of Al Film (for Reference Purpose)>

An Al film having a film thickness of 100 nm was formed on a silicon wafer by deposition under the following conditions.

~Deposition Conditions for Forming Al Film~

EB deposition method

Deposition material: Al, purity 4N (manufactured by Japan Pure Chemical Co., Ltd.)

Final vacuum degree: $5.0\times10^{-5}$ Pa

Film forming rate: 10 nm/min

<Formation of ITO Film (for Reference Purpose)>

An amorphous ITO film having a film thickness of 100 nm was formed on the silicon wafer by sputtering under the following conditions.

~Sputtering Conditions for Forming ITO Film~

Target: 4-inch ITO target (purity:4N; composition ratio: In$_2$O$_3$ (90% by mass)+SnO$_2$ (10% by mass))

Sputtering system: DC magnetron sputtering

Final vacuum degree (when gas is not introduced):$6\times10^{-6}$ Pa

Film forming pressure (when gas is introduced):$4.1\times10^{-1}$ Pa

Film forming temperature: room temperature (substrate temperature: from 23° C. to 25° C.)

Flow rate of Ar: 100 sccm

Flow rate of O$_2$: 7.5 sccm

Power supply: DC 500 W

<Measurement of Etching Rate>

With regard to each of the five films described above, the etching rates (etching speeds) in the following etching liquids (liquid temperature: from 20° C. to 25° C.) were obtained.

The etching rates were obtained using a spectroscopic ellipsometer and a contact-stylus film thickness gage.

~Etching Liquids~

$H_2O_2$ aqueous solution: an aqueous solution of hydrogen peroxide manufactured by Kanto Chemical Co., Ltd. (aqueous solution containing $H_2O_2$ at a concentration of from 30% by mass to 35.5% by mass)

ALE (for reference purpose): a mixed acid aluminum etching liquid manufactured by Kanto Chemical Co., Ltd. (aqueous solution containing 73% by mass of phosphoric acid, 3% by mass of nitric acid, and 7% by mass of acetic acid)

$H_2SO_4$ (9.6%) (for reference purpose): an aqueous solution containing 9.6% by mass of $H_2SO_4$ The etching rates (nm/min) of each film in the etching liquids are shown in Table 1.

TABLE 1

|  | $H_2O_2$ Aqueous Solution | ALE (Reference) | $H_2SO_4$ (9.6%) (Reference) |
| --- | --- | --- | --- |
| IGZO | 0.004 | 155.5 | 312.6 |
| Mo | 192.5 | 289.0 | 0.016 |
| W | 180.5 | 270.0 | 0.25 |
| Al (Reference) | ~0 | 38.1 | 0.22 |
| ITO (Reference) | 0.002 | 2.43 | 13.8 |

(unit: nm/min)

It is found from the results shown in Table 1 that, when the $H_2O_2$ aqueous solution was used as the etching liquid, only Mo and W were etched, and IGZO, Al and ITO were not etched. Here, it is thought that the values of the etching rates of IGZO and ITO are within a range of measurement errors.

From the results shown in Table 1, the etching selection ratio between Mo and IGZO (etching rate of Mo/etching rate of IGZO) in the $H_2O_2$ aqueous solution is calculated to be $5 \times 10^4$; however, when the value of the etching rate of IGZO is considered as a measurement error, the etching selection ratio between Mo and IGZO is substantially $\infty$ (infinity). Similarly, the etching selection ratio between W and IGZO (etching rate of W/etching rate of IGZO) in the $H_2O_2$ aqueous solution is also calculated to be $5 \times 10^4$; however, when the value of the etching rate of IGZO is considered as a measurement error, the etching selection ratio between W and IGZO is substantially $\infty$ (infinity).

On the contrary, when ALE was used as the etching liquid, all of the five films were etched. In particular, the etching rates of IGZO, Mo, and W were large.

The etching selection ratio between Mo and IGZO (etching rate of Mo/etching rate of IGZO) in ALE was 1.86. Further, the etching selection ratio between W and IGZO (etching rate of W/etching rate of IGZO) in ALE was 1.74.

Note that, ALE, which is a mixed acid aluminum etching liquid, was used in this example. "MO ETCHANT" (trade name) manufactured by Kanto Chemical Co., Ltd., which is a commercially available etchant exclusively for Mo, is also a mixed etching liquid containing phosphoric acid and nitric acid, similar to the components of ALE.

Consequently, it is thought that when "MO ETCHANT" (trade name) is used, results similar to the results in this example are obtained.

When $H_2SO_4$ (9.6%) was used as the etching liquid, all of the five films were etched. In particular, the etching rate of IGZO was extremely large.

Next, Example 1 and SID 08 DIGEST, pages 625 to 628 were compared also in consideration of the additional experiment described below. In the following, the details are explained.

It is described on pages 625 to 628 of SID 08 DIGEST that the etching rate of Mo is from 100 Å/sec to 150 Å/sec (from 600 nm/min to 900 nm/min) and the etching rate of IGZO is from 10 Å/sec to 30 Å/sec (from 60 nm/min to 180 nm/min). There is no description concerning the information of the etching liquid in the description on pages 625 to 628 of SID 08 DIGEST. However, based on the values of the etching rates of Mo and the etching rates of IGZO described above, it is readily deduced that the etching liquid used in SID 08 DIGEST is an etching liquid exclusively for Mo (a mixed etching liquid containing phosphoric acid and nitric acid).

Next, as an additional experiment, an IGZO film having a composition ratio (mole ratio) of In:Ga:Zn=1:0.8-0.9:0.65-0.75 was formed using the above-described IGZO target alone, and the etching rate of the resulting IGZO film in ALE was measured.

The etching rate of the resulting IGZO film (In:Ga:Zn=1:0.8-0.9:0.65-0.75) was 78 nm/min. It was about half the etching rate of the IGZO film (In:Ga:Zn=1:1:1), 155.5 nm/min, shown in Table 1. It is thought that the low etching rate of the IGZO film having a low Zn content is caused by the vulnerability of Zn element to etching by an acid.

When comparing the etching rates of the two IGZO films having different compositions in this example and the etching rate of the IGZO film described on pages 625 to 628 of SID 08 DIGEST, there is hardly any difference. Therefore, it is inferred that the composition of the IGZO film described on pages 625 to 628 of SID 08 DIGEST is substantially similar to the composition of the IGZO film (In:Ga:Zn=1: from 0.8 to 0.9: from 0.65 to 0.75) or the composition of the IGZO film (In:Ga:Zn=1:1:1).

For the reasons described above, it is inferred that the description on pages 625 to 628 of SID 08 DIGEST describes formation of a TFT through deposition of a Mo film on an IGZO film having a composition substantially similar to that of the IGZO film in the present example, and wet etching of the Mo film using a mixed etching liquid containing phosphoric acid and nitric acid whereby a source electrode and drain electrode are made.

However, when forming TFTs on a large-area substrate such as substrates for LCDs (liquid crystal displays), wet etching described on pages 625 to 628 of SID 08 DIGEST leads to thickness reduction of the IGZO film, as a result of which there are cases where in-plane irregularities in TFT characteristics increases due to the influences of unevenness of the concentration of the etching liquid and unevenness of the composition of the IGZO film.

Use of the $H_2O_2$ aqueous solution as described in Example 1 for wet etching of Mo enables substantially complete prevention of thickness reduction of the IGZO film. Therefore, the problems described above can be solved.

Example 2

Confirmation of Etchability

Next, as Example 2, evaluation was performed using the aqueous solution of hydrogen peroxide used in Example 1, thereby confirming the etchability of the Mo film.

<Etchability of Mo Film Disposed on Thermal Oxidation Film (Reference)>

Before performing the confirmation of the etchability of a Mo film formed on an IGZO film, the etchability of a Mo film formed on a thermal oxidation film was confirmed as a preliminary examination.

Specifically, on a thermal oxidation film ($SiO_2$ film) of a thermal oxidation film-attached silicon wafer, a Mo film having a film thickness of 200 nm was formed under the same conditions as the conditions for forming a Mo film employed in Example 1. Here, since the film forming rate (film forming speed) of Mo under the sputtering conditions for forming a Mo film employed in Example 1 was 10 nm/min, the film forming time was set to 20 minutes, thereby forming a Mo film.

Then, a photoresist was coated on the resultant Mo film to form a coating film, and the resultant coating film was pre-baked (120° C.). To the coating film after pre-baking, pattern exposure, development, and post-baking (120° C.) were performed in this order, whereby a resist pattern was formed.

Then, using the resultant resist pattern as an etching mask, etching of Mo film was performed using the $H_2O_2$ aqueous solution used in Example 1 under the conditions of a liquid temperature of from 20° C. to 25° C. and an etching time of 120 seconds (which allows sufficient removal of the Mo film).

Thereafter, the resist pattern was removed.

Figure 6:
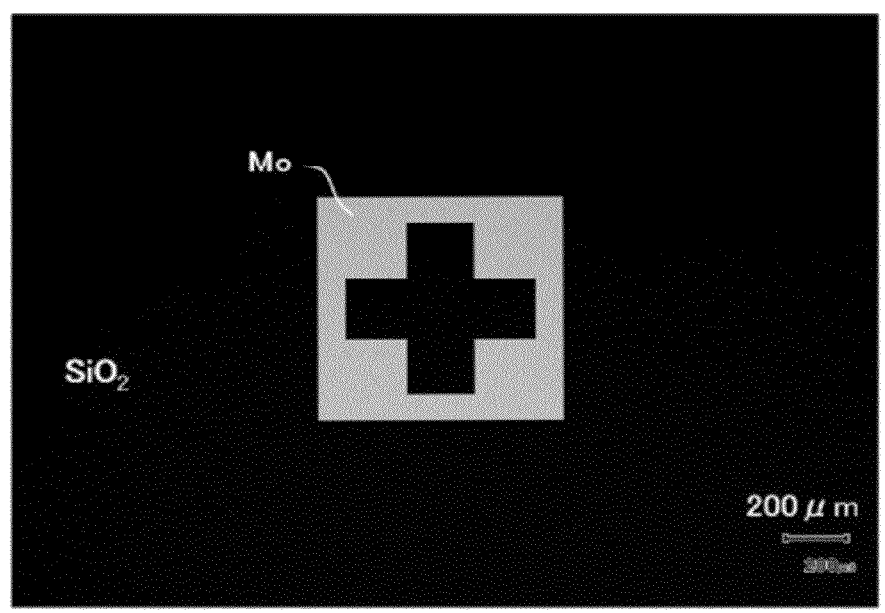
FIG. 6 is an optical microscope photograph of a patterned Mo film disposed on a thermal oxidation film.

FIG. 6 is an optical microscope photograph of the silicon wafer after the removal of the resist pattern, in which the silicon wafer is observed from a side at which the Mo film is provided.

As is shown in FIG. 6, there is no particular disorder in the pattern edge of the Mo film, and the Mo film was precisely patterned.

<Etchability of Mo Film Disposed on IGZO Film>

On a thermal oxidation film ($SiO_2$ film) of a thermal oxidation film-attached silicon wafer, an IGZO film (In:Ga:Zn=1:1:1) having a film thickness of 50 nm was formed under the same conditions as the conditions for forming an IGZO film employed in Example 1. In this process, the IGZO film was formed in a pattern using a metal mask (shadow mask).

Then, forming a Mo film, forming a resist pattern, etching, and removing the resist pattern were performed under the same conditions as in the above paragraph of "Etchability of Mo Film disposed on Thermal Oxidation Film."

Figure 7:
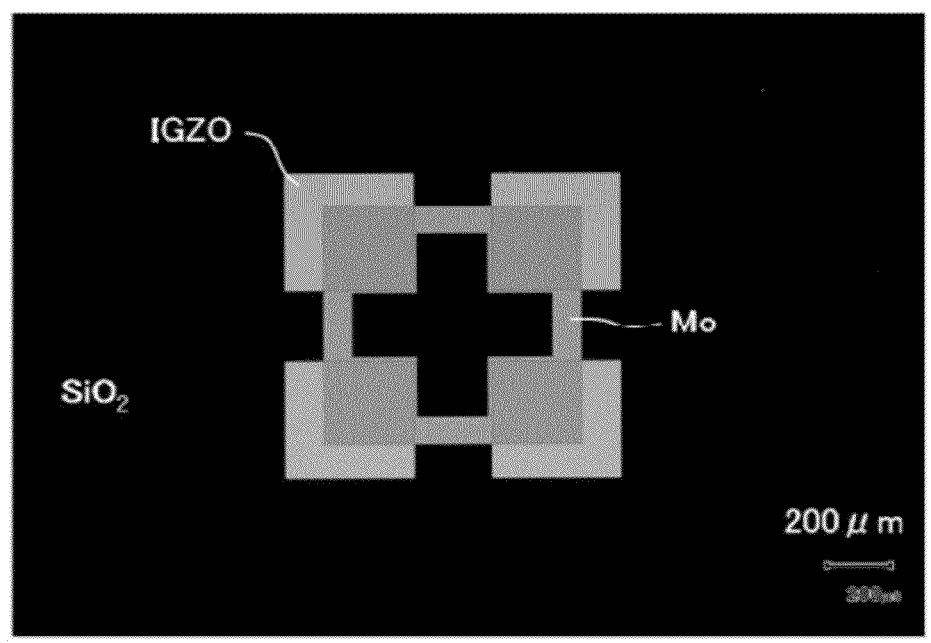
FIG. 7 is an optical microscope photograph of a patterned Mo film disposed on an IGZO film and a thermal oxidation film.

FIG. 7 is an optical microscope photograph of the silicon wafer after the removal of the resist pattern, in which the silicon wafer is observed from a side at which the Mo film is provided.

As is shown in FIG. 7, there is no particular disorder in the pattern edge of the Mo film disposed on the IGZO film, and the Mo film disposed on the IGZO film was precisely patterned.

Further, measurement of the film thickness confirmed that thickness reduction of the IGZO film did not occur.

Example 3

Next, in Example 3, a TFT was actually prepared in accordance with the above-described exemplary method of manufacturing a thin film transistor (FIG. 1 (A) to (H)).

Here, a PEN film (polyethylene naphthalate film; Q65FA, trade name, manufactured by DuPont Teijin Films) having a thickness of 150 μm was used as the substrate 10.

An Al (aluminum) film having a film thickness of 90 nm was formed by sputtering, and then patterning was performed by wet etching, whereby the gate electrode 12 was formed.

A $SiO_2$ film having a film thickness of 100 nm was formed by sputtering, whereby the gate insulating film 14 was formed.

The IGZO film 16 was formed under the same conditions as the conditions for forming an IGZO film (In:Ga:Zn=1:1:1) employed in Example 1, while adjusting the duration of the film formation so as to obtain a film having a film thickness of 50 nm.

Patterning of the IGZO film 16 to form the active layer 18 was conducted by wet etching.

The source electrode 20A and the drain electrode 20B were formed by forming a Mo film, patterning the Mo film by photolithography and wet etching, and then removing the resist pattern.

The Mo film was formed under the same conditions as the conditions for forming a Mo film employed in Example 2, such that the Mo film obtained had a thickness of 200 nm.

The wet etching was performed using the $H_2O_2$ aqueous solution used in Example 1 under the conditions of a liquid temperature of from 20° C. to 25° C. and an etching time of 120 seconds.

The protective film 22 was prepared by forming a $SiO_2$ film having a film thickness of 100 nm by sputtering.

The contact hole 24 was formed by photolithography and etching. With regard to the etching, dry etching was performed this time.

The pixel electrode 26 was formed by forming an Al film having a film thickness of 100 nm by sputtering, and then performing patterning by wet etching.

The TFT prepared as described above was examined with respect to film thickness, and it was confirmed that thickness reduction of the IGZO film did not occur.

Further, the TFT prepared as described above had a high ON-OFF ratio (ON current/OFF current) and exhibited excellent transistor characteristics.

Furthermore, use of the TFT (TFT-attached substrate) prepared as described above as a component allows preparation of a liquid crystal display or organic EL display which is flexible and has excellent display quality.

In Example 2 and Example 3, an example in which a Mo film is used as the metal film containing at least one of W or Mo was explained as an example of the present invention. However, similarly to Examples 2 and 3, thickness reduction of the IGZO film can be suppressed and a TFT having excellent transistor characteristics can be prepared also when a W film or other types of metal film containing at least one of W or Mo are used. This is clear from the etching rate of the W film and the etching selection ratio between W and IGZO (etching rate of W/etching rate of IGZO) described in Example 1.

According to the present invention, a method of manufacturing an electronic device is provided, with which, when performing wet etching of a metal film containing at least one of W or Mo, thickness reduction of an underlying oxide semiconductor film which contains In, Ga, and Zn is suppressed, and deterioration of device characteristics due to the film thickness reduction is suppressed.

Further, according to the present invention, an electronic device in which thickness reduction of an oxide semiconductor film containing In, Ga, and Zn is suppressed and which has excellent device characteristics is provided.

Further, according to the present invention, a display which is equipped with an electronic device having excellent device characteristics and which has excellent display quality is provided.

Furthermore, according to the present invention, a sensor which is equipped with an electronic device having excellent device characteristics and which has high sensitivity is provided.

Embodiments of the present invention include, but are not limited to, the following.

<1>. A method of manufacturing an electronic device comprising:

preparing a film-attached substrate comprising a substrate, and an oxide semiconductor film containing In, Ga, and Zn and a metal film containing at least one of W or Mo provided in this order on the substrate; and wet-etching the metal film of the film-attached substrate using an etching liquid of which a main component is hydrogen peroxide under conditions such that an etching selection ratio between the metal film and the oxide semiconductor film (etching rate of the metal film/etching rate of the oxide semiconductor film) is 100 or higher.

<2> The method of manufacturing an electronic device according to <1>, wherein the substrate comprises a resin substrate.

<3> The method of manufacturing an electronic device according to <1> or <2>, wherein the oxide semiconductor film comprises an amorphous oxide semiconductor film.

<4> The method of manufacturing an electronic device according to any one of <1> to <3>, wherein an oxide semiconductor in the oxide semiconductor film comprises a compound represented by the following Formula (I):

$$(In_{2-X}Ga_X)O_3 \cdot (ZnO)_m \qquad \text{Formula (I)}$$

wherein, in Formula (I), X represents a number of from more than 0 to less than 2, and m represents a positive integer.

<5> The method of manufacturing an electronic device according to any one of <1> to <4>, wherein the oxide semiconductor film is formed by a vapor phase film forming method.

<6> The method of manufacturing an electronic device according to any one of <1> to <5>, wherein the content of hydrogen peroxide in the etching liquid is 80% by mass or higher with respect to all the components, excluding solvents, of the etching liquid.

<7> An electronic device manufactured by the method of manufacturing an electronic device according to any one of <1> to <6>.

<8> The electronic device according to <7>, wherein the electronic device is a thin film transistor.

<9> A display equipped with the electronic device according to <7> or <8>.

<10> A sensor equipped with the electronic device according to <7> or <8>.

All publications, patent applications, and technical standards mentioned in this specification are herein incorporated by reference to the same extent as if each individual publication, patent application, or technical standard was specifically and individually indicated to be incorporated by reference.

What is claimed is:

1. A method of manufacturing an electronic device comprising:
    preparing a film-attached substrate comprising a substrate, and an oxide semiconductor film containing In, Ga, and Zn and a metal film containing at least one of W or Mo provided in this order on the substrate; and
    wet-etching the metal film of the film-attached substrate using an etching liquid of which a main component is hydrogen peroxide under conditions such that an etching selection ratio between the metal film and the oxide semiconductor film (etching rate of the metal film/etching rate of the oxide semiconductor film) is 100 or higher.

2. The method of manufacturing an electronic device according to claim 1, wherein the substrate comprises a resin substrate.

3. The method of manufacturing an electronic device according to claim 1, wherein the oxide semiconductor film comprises an amorphous oxide semiconductor film.

4. The method of manufacturing an electronic device according to claim 1, wherein an oxide semiconductor in the oxide semiconductor film comprises a compound represented by the following Formula (I):

$$(In_{2-X}Ga_X)O_3 \cdot (ZnO)_m \qquad \text{Formula (I)}$$

wherein, in Formula (I), X represents a number of from more than 0 to less than 2, and m represents a positive integer.

5. The method of manufacturing an electronic device according to claim 1, wherein the oxide semiconductor film is formed by a vapor phase film forming method.

6. The method of manufacturing an electronic device according to claim 1, wherein the content of hydrogen peroxide in the etching liquid is 80% by mass or higher with respect to all the components, excluding solvents, of the etching liquid.

7. An electronic device manufactured by the method of manufacturing an electronic device according to claim 1.

8. The electronic device according to claim 7, wherein the electronic device is a thin film transistor.

9. A display equipped with the electronic device according to claim 7.

10. A sensor equipped with the electronic device according to claim 7.

* * * * *